US012642017B2

(12) United States Patent
Liao et al.

(10) Patent No.: US 12,642,017 B2
(45) Date of Patent: May 26, 2026

(54) SEMICONDUCTOR DEVICES AND METHODS OF MANUFACTURING THEREOF

(71) Applicant: Taiwan Semiconductor Manufacturing Company, Ltd., Hsinchu (TW)

(72) Inventors: Shu-Ling Liao, Taichung City (TW); Te-En Cheng, Taoyuan City (TW); Nai-Yu Yeh, Changhua City (TW); Ming-Han Chung, Hsinchu City (TW); Chunyao Wang, Zhubei City (TW); Yung-Cheng Lu, Hsinchu City (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 533 days.

(21) Appl. No.: 18/103,370

(22) Filed: Jan. 30, 2023

(65) Prior Publication Data

US 2024/0258100 A1    Aug. 1, 2024

(51) Int. Cl.
| *H01L 21/02* | (2006.01) |
| *H10D 30/01* | (2025.01) |
| *H10D 30/62* | (2025.01) |
| *H10P 14/60* | (2026.01) |

(52) U.S. Cl.
CPC ..... *H10P 14/6686* (2026.01); *H10D 30/0243* (2025.01); *H10D 30/62* (2025.01); *H10P 14/6336* (2026.01); *H10P 14/6339* (2026.01)

(58) Field of Classification Search
None
See application file for complete search history.

(56) References Cited

U.S. PATENT DOCUMENTS

| 2006/0046508 | A1* | 3/2006 | Nemani | ............ H01L 21/02214 |
| | | | | 438/758 |
| 2011/0262642 | A1* | 10/2011 | Xiao | ........................ C07F 7/025 |
| | | | | 427/255.394 |
| 2019/0233940 | A1* | 8/2019 | Guo | .................. H01L 21/02271 |
| 2020/0350429 | A1 | 11/2020 | Kim et al. | |
| 2021/0151579 | A1* | 5/2021 | Canaperi | .............. H10D 30/024 |

FOREIGN PATENT DOCUMENTS

| TW | 201916360 A | 4/2019 |
| TW | 201935570 A | 9/2019 |

OTHER PUBLICATIONS

Office Action issued in connection with Taiwan Appl. No. 112124818 dated Jun. 12, 2024.

* cited by examiner

*Primary Examiner* — Asok K Sarkar
(74) *Attorney, Agent, or Firm* — Foley & Lardner LLP

(57)         ABSTRACT

Fabrication of semiconductor devices is provided. A chamber is evacuated to a pressure of less than about 1 Torr. The chamber is heated to a temperature in excess of about 400° C. A precursor is introduced into the chamber. The precursor is decomposed with a first plasma. A first layer is deposited on a surface of the semiconductor device based on the decomposed precursor. The precursor is densified to form a first gate spacer. The precursor is introduced into the chamber subsequent to forming the first layer. The precursor is decomposed with a second plasma. A second layer is deposited on the surface of the semiconductor device based on the decomposed precursor. The deposited precursor is densified to form a second gate spacer.

20 Claims, 14 Drawing Sheets

SEMICONDUCTOR DEVICES AND METHODS OF MANUFACTURING THEREOF

BACKGROUND

The semiconductor industry has experienced rapid growth due to continuous improvements in the integration density of a variety of electronic components (e.g., transistors, diodes, resistors, capacitors, etc.). For the most part, this improvement in integration density has come from repeated reductions in minimum feature size, which allows more components to be integrated into a given area.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIG. 5 illustrates tetramethyldisiloxane (TMDSO) molecule, an example precursor for various operations of the method of FIG. 4, in accordance with some embodiments.

DETAILED DESCRIPTION

Figure 1:
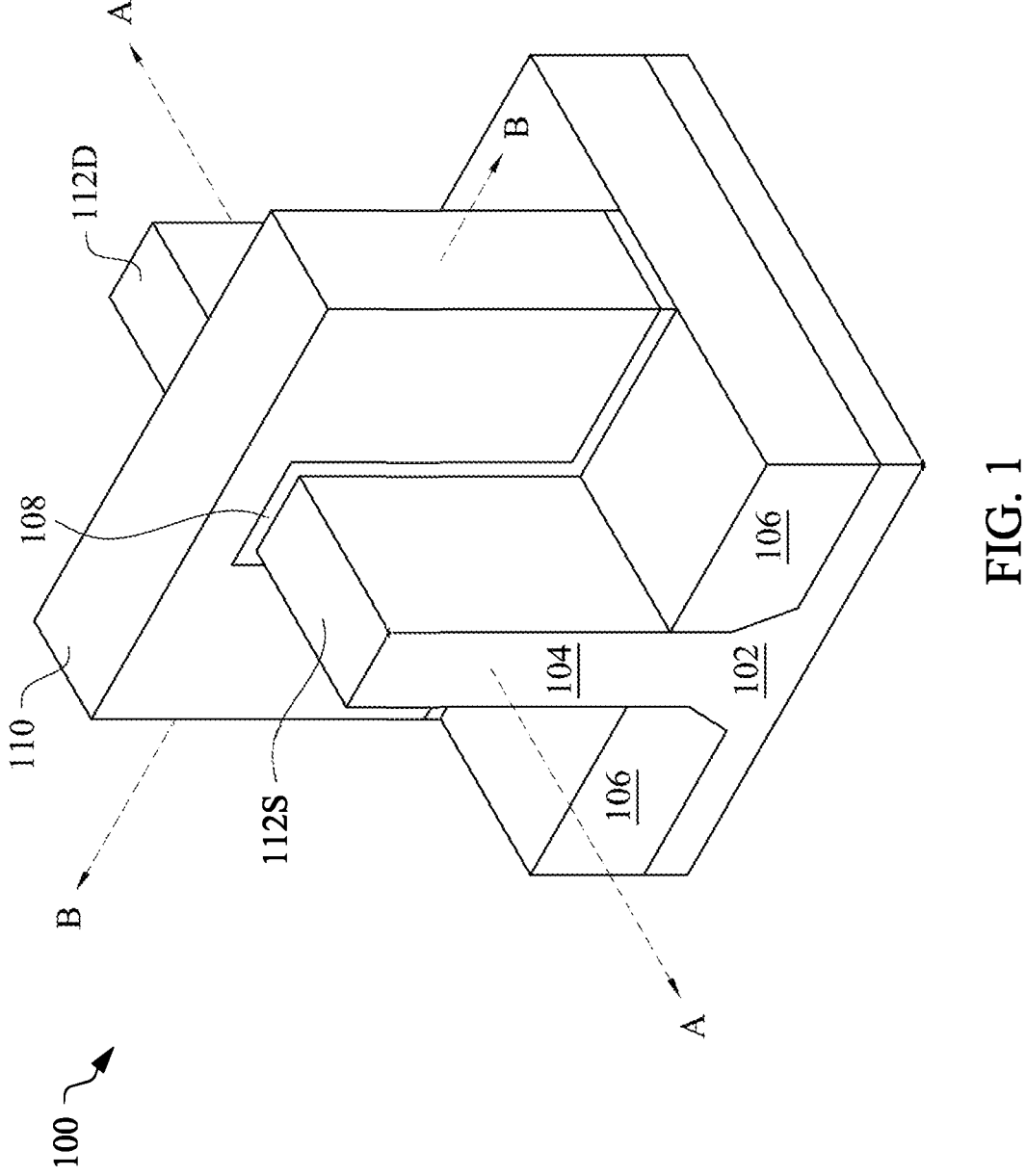
FIG. 1 illustrates a perspective view of a fin field-effect transistor (FinFET) device, in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over, or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" "top," "bottom" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly. References to "or" may be construed as inclusive so that any terms described using "or" may indicate any of a single, more than one, and all of the described terms.

In general, a spacer can be formed over a PO (e.g., poly-Si) layer of a semiconductor device (e.g., a transistor), which serves as a dummy gate of the transistor. The PO layer can be later replaced with a gate (e.g., a metal gate), such as for a gate-last semiconductor process. The spacer is typically formed of one or more dielectric materials. A dielectric constant (sometimes designated as "k") of the dielectric material can impact performance of the transistor. For example, high parasitic capacitance can usually be induced by a high dielectric constant of the spacer, which can disadvantageously impact the performance of the transistor. Thus, it may be desirable to form a spacer from a material with a substantially low dielectric constant (e.g., k not greater than 5).

The present disclosure provides various embodiments of a semiconductor device with one or more spacer materials that each have a substantially low dielectric constant (e.g., k not greater than 5) and methods for forming the same. For example, the one or more spacer materials can be deposited according to an atomic layer deposition (ALD) process or an ALD-like process. The ALD or ALD-like process can provide a precursor such as tetramethyldisiloxane (TMDSO), apply low-power radio-frequency (RF) energy with a gas or plasma containing hydrogen, oxygen, or nitrogen radicals to decompose the precursor. The decomposed TMDSO derivatives, such as silicon carbonate ($Si_xC_yO_z$) or Silicon Carbonate Nitride ($Si_xC_yO_zN_A$) can be deposited onto a surface of semiconductor device, (e.g., over a dummy gate) and densified by an application of higher power RF energy. A first gate spacer can be formed for one or more SiCO or SiCON (e.g., silicon oxycarbonitride) layers. For example, a first gate spacer can be formed from SiCON materials to abut the PO layer. The SiCON (or SiCO) material can be selected according to a resistivity to an etchant or other process to remove the PO layer and for a metal gate. A second gate spacer can be formed from a SiCO material having a dielectric constant not lower than the first gate spacer.

FIG. 1 illustrates a perspective view of an example FinFET device 100, in accordance with some embodiments. The FinFET device 100 includes a substrate 102 and a fin 104 protruding above the substrate 102. Isolation regions 106 are formed on opposing sides of the fin 104, with the fin 104 protruding above the isolation regions 106. A gate dielectric 108 is along the sidewalls (which may not be depicted according to some views) and over a top surface of the fin 104, and a gate 110 is over the gate dielectric 108. Source/drain regions 112D and 112S are in the fin 104 and on opposing sides of the gate dielectric 108 and the gate 110. The source/drain regions 112D and 112S extend outward from the gate 110. The gate can be a metal gate or a PO layer can thereafter be replaced, in portion or in full, with a metal gate. FIG. 1 is provided as a reference to illustrate an example application in subsequent figures. This example is not intended to be limiting. For example, the spacer can be applied to further portions of the planar transistors, gate all around (GAA) transistors, and the like.

Figure 2:
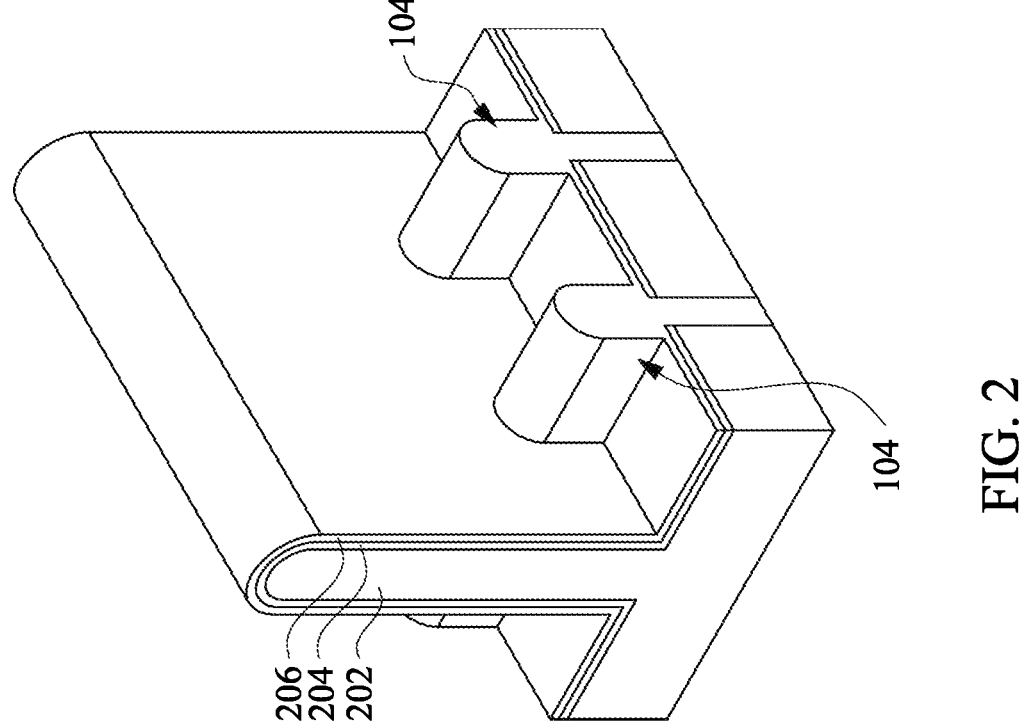
FIG. 2 illustrates a cross-sectional view of an example FinFET device during fabrication stages, in accordance with some embodiments.

FIG. 2 illustrates a cross-sectional view of an example FinFET device during fabrication stages, in accordance with some embodiments. The FinFET device 100 comprises two fins 104; various embodiments can include additional or fewer fins 104. The gate 110 of FIG. 1 is omitted. A PO layer 202 (e.g., which can also be referred to as a dummy gate) covers the fins 104. A first gate spacer 204 can be formed over the PO layer. A second gate spacer 206 can be formed over the first gate spacer 204. Further fabrication operations can be performed such as formation of a metal gate (not depicted). The metal gate can be formed by a planarization of an upper surface of the semiconductor device, a selective etch of the PO layer 202 and a metal deposition to replace an opening from the selective etch of the PO layer 202. Said differently, the PO layer 202 can be a dummy gate for a gate-last process.

Figure 3:
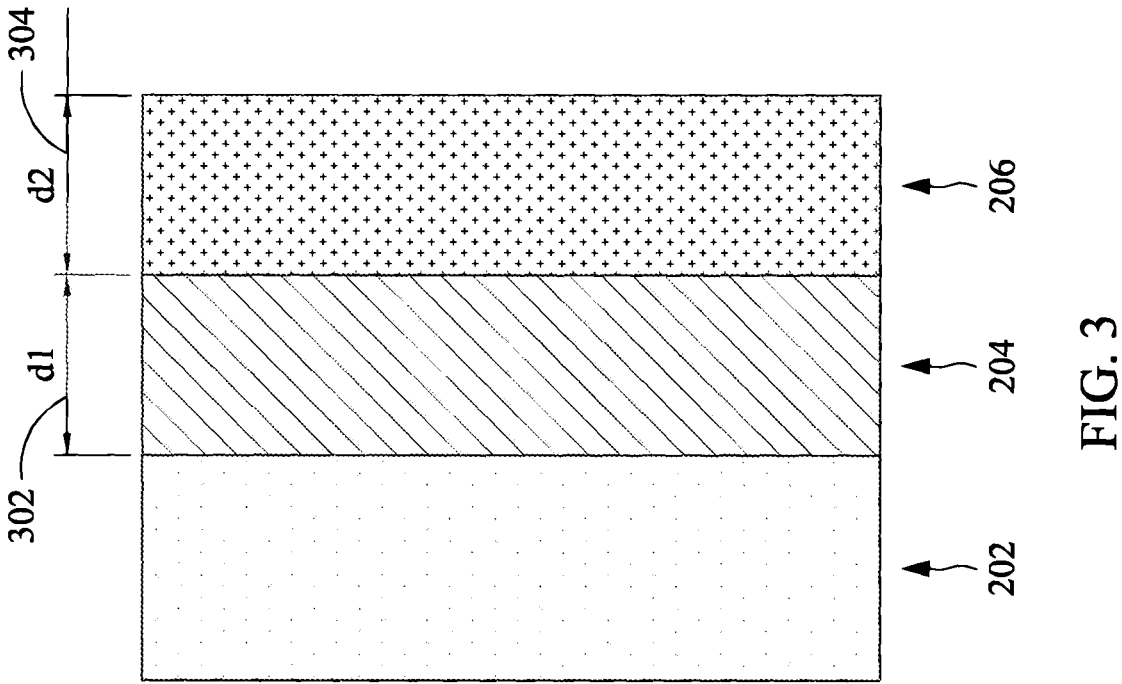
FIG. 3 illustrates a detail view of a gate spacer formed over the PO layer, in accordance with some embodiments.

FIG. 3 illustrates a detail view of a gate spacer formed over the PO layer 202, in accordance with some embodiments. Particularly, a first gate spacer 204 and a second gate spacer 206 are depicted. According to various embodiments, additional or fewer gate spacers can be formed. The gate spacers can include various sub-layers, including boundaries or gradients (not depicted) therebetween according to the various gate spacer materials discussed herein. Each gate spacer or portion thereof can be associated with a thickness. For example, the first gate spacer 204 can be associated with a first thickness 302 and the second gate spacer 206 can be associated with a second thickness 304. The first gate spacer 204 can be of lesser thickness than the second gate spacer 206. For example, the first gate spacer 204 can be less than about 2 nm in thickness (e.g., between about 0.5 nm and about 2 nm). Such a dimension may form a barrier over the gate 110 or dummy gate, such as during a formation thereof or an intermediate process, including an etching process, to reduce or eliminate contact between the gate 110 or dummy gate and the second gate spacer. The second gate spacer 206 can be greater than about 1.5 nm in thickness (e.g., between about 1.5 nm and about 3.5 nm). Such a dimension may reduce a capacitance relative to a dielectric formed over the second gate spacer 206 (e.g., a high-k dielectric). An etching operation to remove the PO layer 202 or a subsequent forming of a metal gate 110 abutting the first gate spacer 204 can affect a dimension (e.g., thickness) or composition of the first gate spacer 204 according to a selectivity of an etchant with regard to the first gate spacer 204. For example, an etchant or other process (e.g., sputtering) can be selected to avoid diffusion, etching, or other interactions with the first gate spacer 204.

Figure 4:
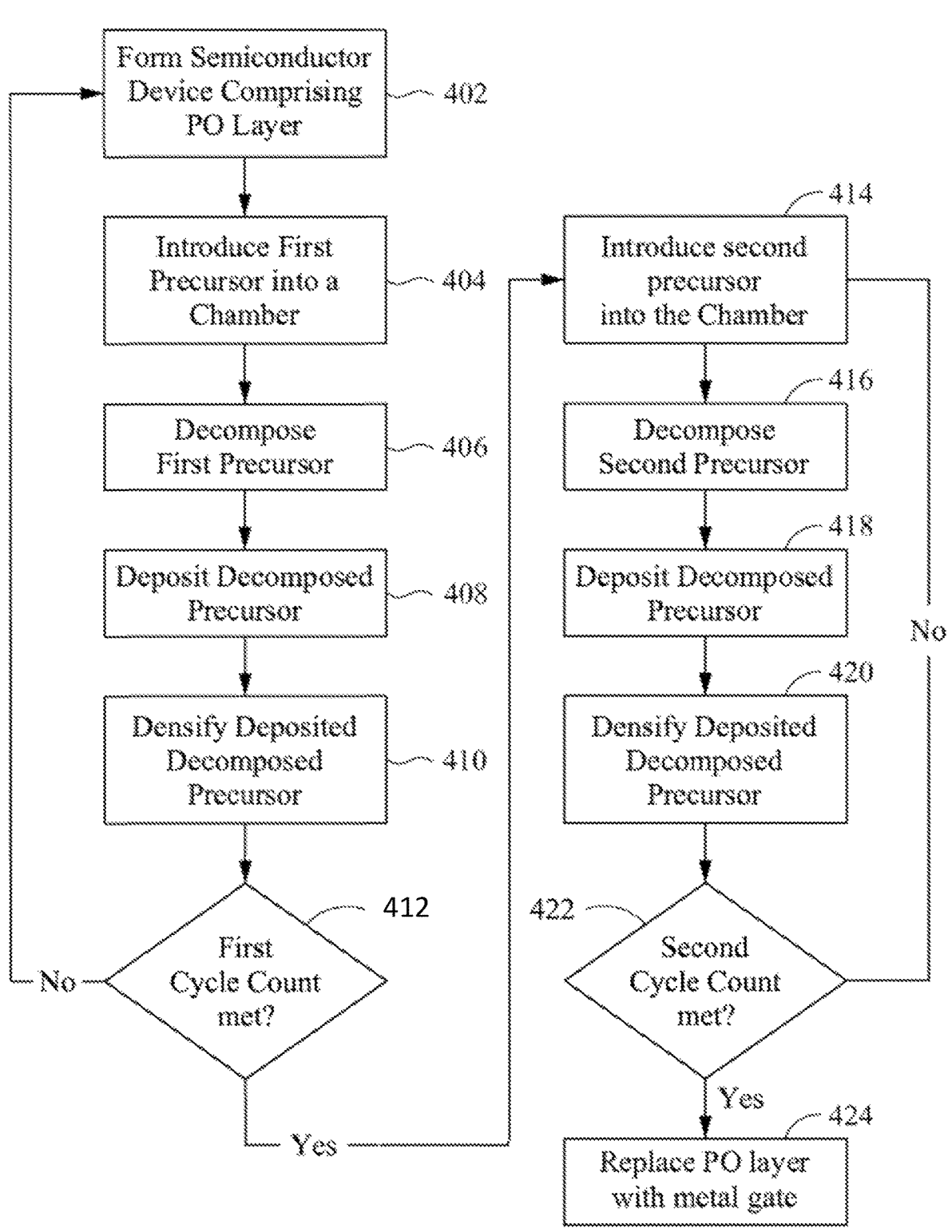
FIG. 4 illustrates a flow chart of an example method for making a semiconductor device, in accordance with some embodiments.

FIG. 4 illustrates a flow chart of an example method 400 for making a semiconductor device, in accordance with some embodiments. For example, at least some of the operations of the method 400 can be used to form a FinFET device (e.g., FinFET device 100), a nanosheet transistor device, a gate-all-around transistor device, a nanowire transistor device, a vertical transistor, or the like. It is noted that the method 400 is merely an example, and is not intended to limit the present disclosure. Accordingly, it is understood that additional operations may be provided before, during, and after the method 400 of FIG. 4, and that some other operations may only be briefly described herein. For example, although no explicit purging of the chamber is disclosed, the chamber may be purged incident to the various operations herein.

In brief overview, the method 400 starts with operation 402 of forming a semiconductor device comprising a PO layer. The method 400 continues to operation 404 of introducing a precursor such as TMDSO into the chamber. The method 400 continues to operation 406 of decomposing the precursor. The method 400 continues to operation 408 of depositing a material based on the decomposed precursor (e.g., a SiCON material) to form a first layer. At operation 410, the decomposed precursor is treated to densify the layer. The method 400 continues to operation 412 including determining if a number of cycle counts is complete. At operation 414, further precursor is introduced to the chamber. At operation 416, the further precursor is decomposed. At operation 418, the decomposed precursor is deposited to form a second layer. The method 400 continues to operation 420 of treating the second layer to densify the second layer. The method 400 continues to operation 422, including determining if a number of cycle counts is complete. At operation 424, the PO layer is replaced with a metal gate.

At operation 402, a semiconductor device is formed comprising a PO layer 202 or other gate such as a dummy gate. For example, the semiconductor device can be a FinFET device 100 having one or more fins 104, and the PO layer 202 can be a dummy gate formed over the fins 104.

At operation 404, a first amount of a precursor such as tetramethyldisiloxane (TMDSO) is introduced into a chamber. The TMDSO can be introduced as a liquid, vapor, or gas. For example, the TMDSO can be introduced as a liquid to a chamber having a temperature in excess of 100° C. (e.g., 400° C., 450° C., or 500° C.), and thereafter boil to form a gaseous state. The chamber can be under partial vacuum (e.g., less than about 1 Torr). The TMDSO can be introduced at a constant or variable rate. For example, the TMDSO can be introduced at a rate corresponding to about 7,000 standard gaseous liters per minute (SLM). The introduction of the precursor can vary according to various materials (e.g., plasmas) introduced therewith. For example, a flow rate can be a flow rate for the TMDSO or a total flow rate comprising gases for plasma formation (e.g., hydrogen gas ($H_2$), oxygen gas ($O_2$), or nitrogen gas ($N_2$) as is further described with respect to operation 406). The introduction of the precursor can vary according to a chamber size. For example, a chamber configured to deposit a gate spacer over a 12 inch wafer can include a greater flow rate that a chamber configured to deposit a spacer over a 4 inch wafer.

Figure 8:
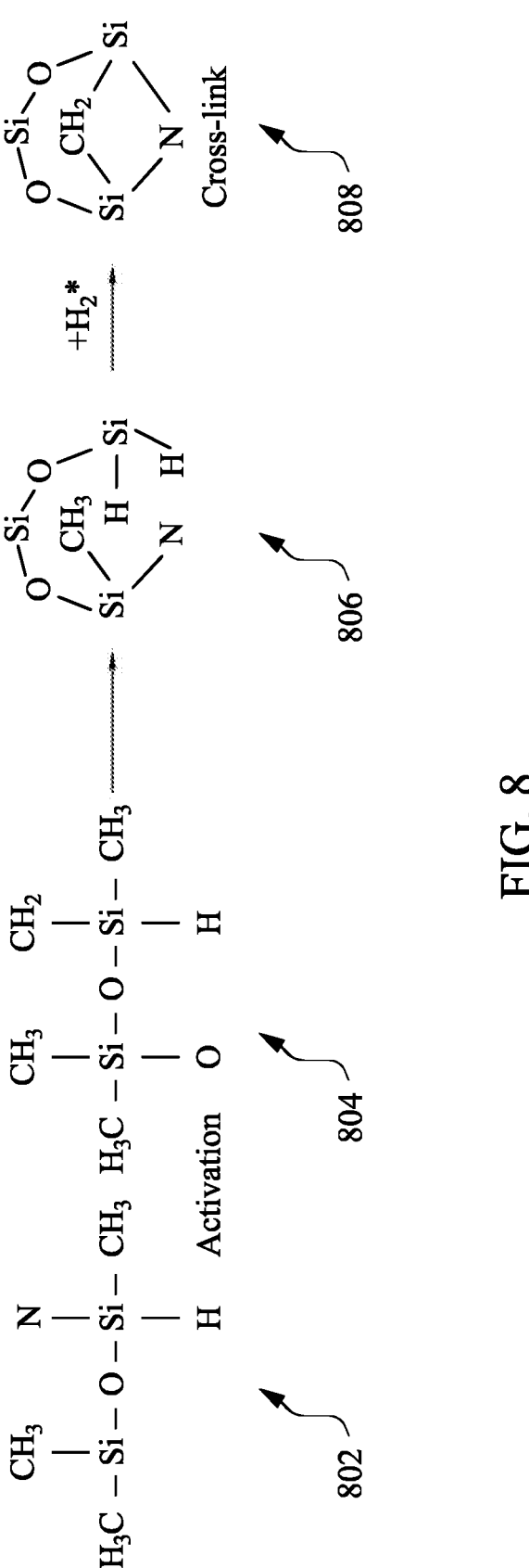
FIG. 8 illustrates a series of example reactions to generate a first gate spacer, in accordance with some embodiments.

At operation 406, the first portion of the precursor is decomposed by the introduction of hydrogen or oxygen ions or radicals. The hydrogen or oxygen ions or radicals can be introduced in an excited state or excited by the chamber. For example, the hydrogen or oxygen ions or radicals can be excited by between about 500 watts of power and about 1,000 watts of power (e.g., 750 watts) at about 13.65 MHz. The decomposition can include a transfer of hydrogen atom from methyl groups, a silicon atom along a silicon-oxygen-silicon backbone of the TMDSO, or other components to generate intermediate compounds, such as those depicted hereinafter, at FIGS. 6 and 8. The decomposition can be referred to as activation, referring to an activation of sites for cross-linking or other reactions at the locations of removed atoms or functional groups (e.g., the hydrogen atoms or methyl groups). In some embodiments, the nitrogen can interact with decomposed precursors. For example, nitrogen gas can be introduced to form intermediate compounds at a site of the removed hydrogen atom or methyl groups (e.g., as depicted at FIG. 8).

At operation 408, a material based on the decomposed precursor, such as SiCON, can be deposited over the semiconductor device. For example, the SiCON can be deposited according to an ALD-like process. The process can include depositing SiCON compounds over an active surface of a wafer to cover the PO layer 202 of the wafer. As described above, nitrogen gas may not be employed at operation 408 for some embodiments. The references to SiCON compounds can be substituted with SiCO compounds including for example, methyltrisiloxane, or the the SiCO compounds depicted hereinafter in FIGS. 6 and 8 (e.g., a first deposition compound 606 or a second deposition compound 806). The non-employment of nitrogen gas can refer to an absence of nitrogen gas, or a presence of trace amounts of nitrogen gas (e.g., less than one percent). The chamber conditions for the deposition can vary between cycles or materials. For example, the chamber pressure can be evacuated to about 1 Torr for the deposition operation, at a temperature of about 550° C.

At operation 410, the deposited material (e.g., SiCO material, such as SiCON) is treated. Treatment (which is also referred to as densification) can cross link various compounds with a surface of the semiconductor device. For example, the treatment can include hydrogen or oxygen ions or radicals to densify the deposited compounds with a surface of the semiconductor device to cross link the compounds therewith. An RF power for the hydrogen or oxygen gas can exceed the RF power for the TMDSO activation (e.g., by a factor of about two or about three). For example, the hydrogen or oxygen ions or radicals can be excited by between about 2,000 watts and about 3,000 watts of RF power (e.g., about 2500 watts) at about 13.65 MHz. The hydrogen gas for the hydrogen ions or radicals can be introduced at a rate of about 20,000 SLM. The oxygen gas for the oxygen ions or radicals can be introduced at a rate of about 30,000 SLM. An inert gas such as argon or helium can be introduced to the chamber along with other gasses at operation 410 or other operations of method 400, (e.g., as a carrier gas). The step coverage of the first layer can vary according to a cycle time, power level, pressure, or materials introduced to the chamber. For example, step coverage exceeding about 90% or about 95% can be realized according to the systems and methods disclosed herein.

At operation 412, a cycle count is determined. The cycle count can be pre-determined or based on a measurements such as step coverage, thickness, material delivered to a surface of a semiconductor wafer, or the like. For example, a cycle count can be determined by a counter and compared to a threshold, or an attribute of the semiconductor device can be determined and compared to a threshold. The threshold can be selected to generate a gate spacer having a thickness of about 0.5 nm to about 2 nm. The method can proceed to operation 402 responsive to a determination that the comparison is indicative of an unmet cycle threshold; the method can proceed to operation 414 responsive to a determination that the comparison is indicative of an achieved cycle threshold. Various cycles can be iterated with different parameters. Each cycle can adjust an amount of material introduced to the chamber, or the chamber conditions. For example, a quantity or proportion of nitrogen gas or a chamber environment can be varied to realize a gradient or separate gate spacers. A greater proportion of nitrogen can deposited proximal to the PO layer 202, and a lesser proportion of nitrogen can be deposited distal to the PO layer 202.

At operation 414, a second portion of precursor such as TMDSO is introduced to the chamber. The TMDSO can be introduced to the chamber at a same or different flow rate, and the chamber can maintain a same or different environment as operation 404 (e.g., less than about 1 Torr, such as about 0.5 Torr and 550° C.). At operation 416, the precursor is activated. The precursor can be activated by oxygen or hydrogen ions or radicals. The ions or radicals can be excited by a same or different RF power as operation 406. For example, the oxygen or hydrogen ions or radicals can be excited by about 750 watts of RF power at about 13.65 MHz. The activation can transport various hydrogen atoms from the TMDSO to create active bonding sites (e.g., to bond to ions or radicals, or a surface of the semiconductor device).

At operation 418, a second layer is formed over the semiconductor device. The second layer can be formed by depositing material based on the decomposed precursor. For example, SiCO compounds can be deposited over a surface of the semiconductor device. The SiCO can contain no nitrogen, essentially no nitrogen, or substantially less nitrogen than the first gate spacer (e.g., no more than one-tenth or one-hundredth). At operation 420, the second layer is densified (i.e., treated) by the application of oxygen or hydrogen ions or radicals. The ions or radicals can be excited by a same or different RF power as operation 410. For example, the oxygen or hydrogen ions or radicals can be excited by about 2600 watts of RF power at about 13.65 MHz.

At operation 422, cycle count is determined. The cycle count can be pre-determined or based on a measurements such as step coverage, thickness, material delivered to a surface of a semiconductor wafer, or the like. For example, a cycle count can be determined by a counter and compared to a threshold, or an attribute of the semiconductor device can be determined and compared to a threshold. The threshold can be selected to generate a gate spacer having a thickness of about 1.5 nm to about 3.5 nm. The method can proceed to operation 414 responsive to a determination that the comparison is indicative of an unmet cycle threshold; the method can proceed to operation 424 responsive to a determination that the comparison is indicative of an achieved cycle threshold. Various cycles can be iterated with different parameters. Each cycle can adjust an amount of material introduced to the chamber, or the chamber conditions. At operation 424, the upper surface of the semiconductor device is planarized, the PO (or other dummy gate) is removed and replaced with a metal gate, such that the sidewalls of the first gate spacer 204 extends along the metal gate 110.

Figure 5:
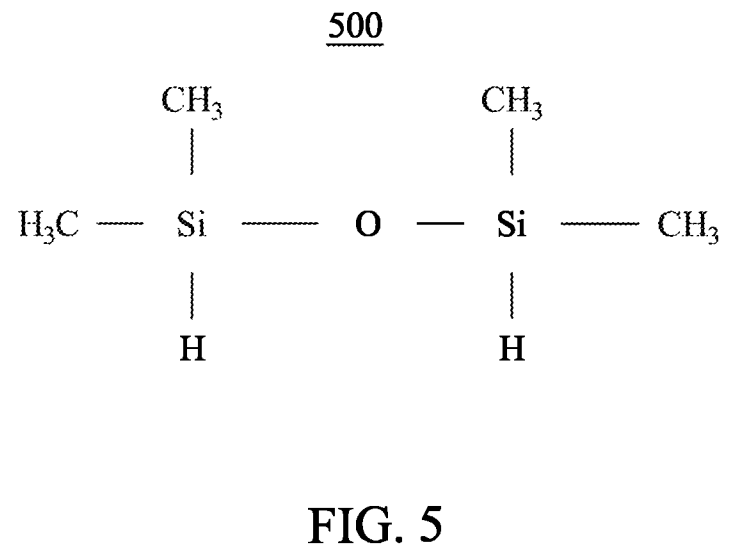

FIG. 5 illustrates a TMDSO molecule 500, an example precursor for various operations of the method of FIG. 4 and other embodiments of the present disclosure, in accordance with some embodiments. The molecule can be introduced into a chamber as a precursor to other operations performed in situ in the chamber. The TMDSO 500 can be introduced as a liquid, vapor, or gas. For example, the TMDSO 500 can be introduced to a chamber as a liquid. The temperature of the chamber can be elevated, or the contents of the chamber can be evacuated to reduce a pressure thereof. The condition of the chamber can result in a liquid-gas state change of the TMDSO 500 or another precursor. In some embodiments, one or more precursor reactions can be performed prior to introduction to the chamber. For example, one or more components based on the precursor (e.g., a decomposed precursor) can be introduced to the chamber.

Figure 6:
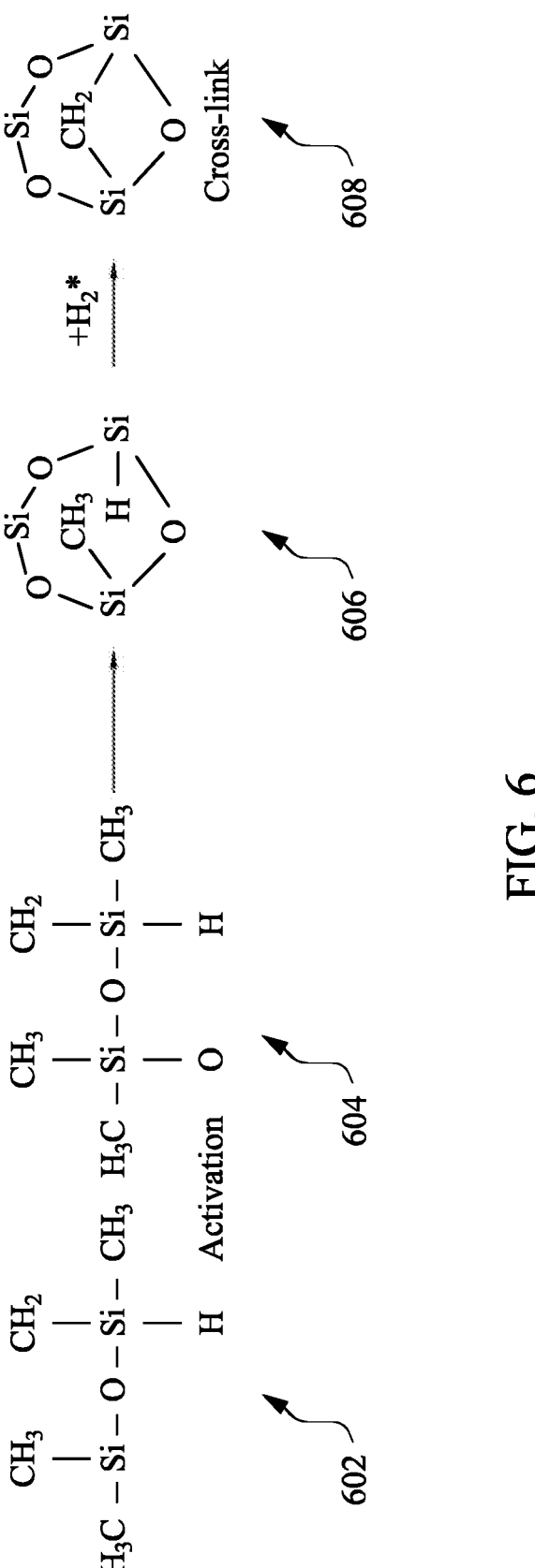
FIG. 6 illustrates various a series of example reactions to generate the first gate spacer or the second gate spacer, according to some embodiments.

FIG. 6 illustrates a series of example reactions to generate the first gate spacer 204 or the second gate spacer 206, according to some embodiments. In some embodiments, the depicted reactions can generate a first gate spacer 204. In some embodiments, further reactions including nitrogen can be included in the first gate spacer 204, and omitted in the second gate spacer 206. In some embodiments, nitrogen can be omitted for the first gate spacer 204 and the second gate spacer 206. Particularly, a first decomposed precursor compound 602 and a second decomposed precursor compound 604 are illustrated. Each of the first decomposed precursor compound 602 and the second decomposed precursor compound 604 include a same silicon-oxygen-silicon backbone as the TMDSO 500 precursor of FIG. 5. However, various hydrogen atoms are transported from the TMDSO 500. For example, hydrogen atoms are stripped from the Si—O—Si backbone to form active sites thereon, or from the various methyl groups to form methylene groups having an active site thereupon. Some methyl or methylene groups can be stripped from the molecule such that the backbone can be merged with other molecules based on the decomposed precursor. For example, a first deposition compound 606 can result from a deposition operation including the decomposed precursor compounds 602, 604. The example decomposed precursor compounds or first deposition compound 606 are not intended to be limiting. Interactions with the plasma (e.g., the low-power plasma of operations 406 and 416) can generate various decomposed precursors which can, in turn form various deposition compounds. For example, deposition compounds can be formed from various combinations of $Si_xC_yO_z$, where X, Y and Z can be any number or proportion. Such molecules can be referred to as SiCO molecules or SiCO compounds.

A deposited compound can be treated to passivate or otherwise chemically alter a layer of a gate spacer or other dielectric layer. For example, a layer can be densified according to operations 410 and 420. The first densified compound 608 depicts a single molecule wherein elemental hydrogen ($H_2$) is formed and released from a combination of a methyl group and a linked hydrogen atom to cross link-portions of the molecule. Such a molecule can be adjoined by various other portions of the layer and can form further densified compound therefrom (e.g., FIG. 7).

Figure 7:
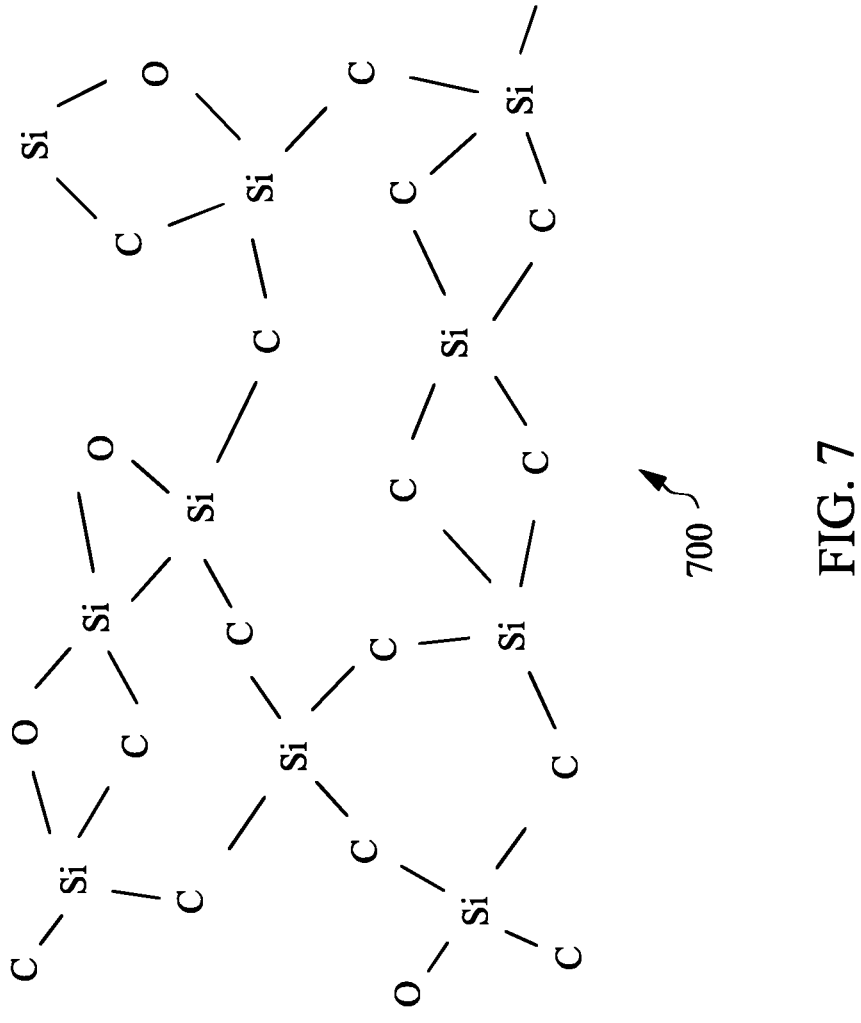
FIG. 7 illustrates an example surface of a first gate spacer or second gate spacer, in accordance with some embodiments.

FIG. 7 illustrates an example surface 700 of a first gate spacer 204 or second gate spacer 206, in accordance with some embodiments. The surface 700 can include various densified compounds such as the first densified compound 608 connected (e.g., densified) by the treatment of operations 410, operation 420, and the like. For example, cross-linking between the densified compound can form a chemically stable, passivated surface. The back bones of the individual densified compounds can be referred to as backbones of the gate spacer or surface 700 thereof. For example, the depicted surface can be said to include silicon-carbon-silicon backbones or silicon-oxygen-silicon backbones.

FIG. 8 illustrates a series of example reactions to generate a first gate spacer 204, in accordance with some embodiments. As for the reactions of FIG. 6, the third decomposed precursor 802 and the fourth decomposed precursor 804 include a same silicon-oxygen-silicon backbone as the TMDSO 500 precursor of FIG. 5. Various hydrogen atoms or methyl groups are stripped from the third decomposed precursor 802 or the fourth decomposed precursor 804. As depicted, one or more nitrogen atoms (e.g., sourced from a nitrogen ion or radical of the first plasma of operation 410) can interface with an active site of the third decomposed precursor 802 or the fourth decomposed precursor 804 vacated by the stripped hydrogen atoms or methyl groups. As depicted, a second deposition compound 806 can include the nitrogen in a backbone or attached thereto. As was described with reference to FIG. 6, the depicted deposition compound and other molecules of FIG. 8 are not intended to be limiting, and are provided as example molecules which can be formed from the various interactions between precursor and derivatives thereof and the plasmas of operation 404, operation 410, operation 414, or operation 420. For example, deposition compounds can be formed from various combinations of $Si_xC_yO_zN_A$, where X, Y, Z, and A can be any number or proportion. The inclusion of the nitrogen can increase the resistivity to a process to remove a PO layer, and increase a dielectric constant. Such molecules can be referred to as SiCON molecules or SiCON compounds, the references to molecules or compounds herein are not intended to be limiting and can be substituted between.

A deposited compound can be treated to passivate or otherwise chemically alter a layer of a gate spacer or other dielectric. For example, a layer can be densified according to operations 410 and 420. The second densified compound 808 depicts a single molecule wherein elemental hydrogen ($H_2$) is formed from a combination of a methyl group and a linked hydrogen atom to cross link-portions of the molecule. A hydrogen atom is stripped and a nitrogen atom at an opposite end of a backbone can connect to a site vacated by the stripped hydrogen atom. For example, the molecule can connect as a cyclic compound. Such a molecule can be adjoined by various other portions of the layer and can form further densified compounds therefrom (e.g., FIG. 9 or 10).

Figure 9:
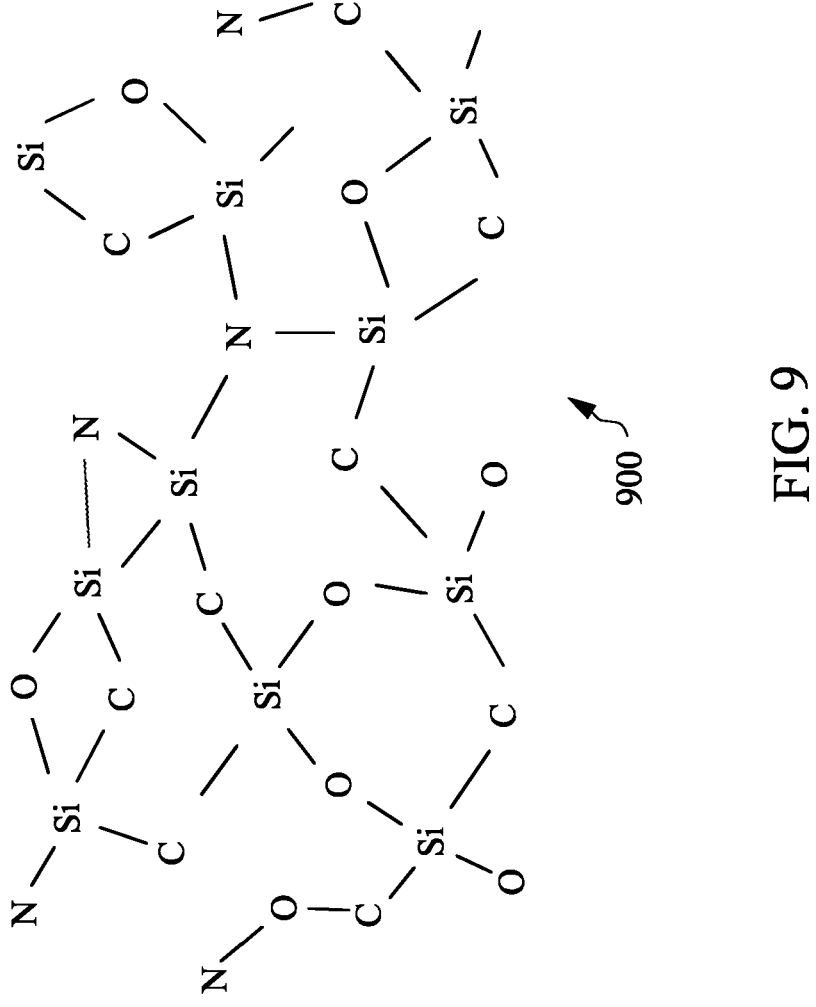
FIG. 9 illustrates an example surface of a first gate spacer, in accordance with some embodiments.

FIG. 9 illustrates an example surface 900 of a first gate spacer 204, in accordance with some embodiments. The surface 900 can include various densified compounds such as the second densified compound 808 connected (e.g., densified) by the treatment of operation 410, operation 420, and the like. For example, cross-linking between the densified compound can form a chemically stable, passivated surface. The back bones of the individual densified compounds can be referred to as backbones of the gate spacer. For example, the depicted surface can be said to include silicon-carbon-silicon backbones, silicon-oxygen-silicon backbones, or silicon-nitrogen-silicon backbones.

Figure 10:
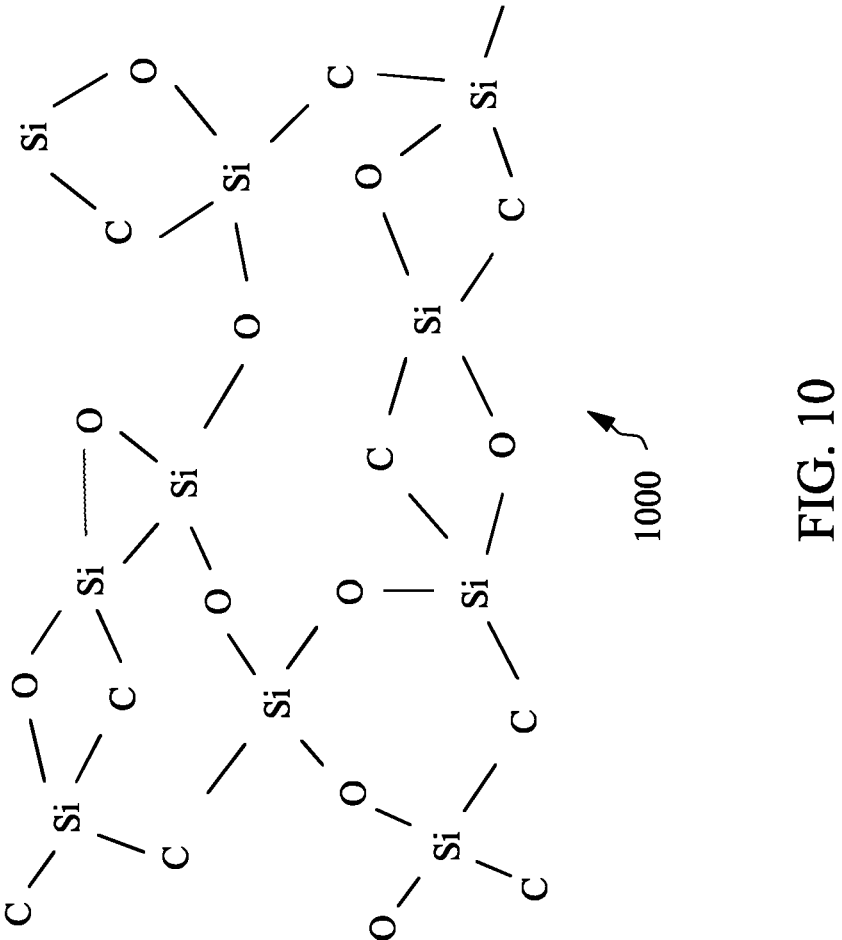
FIG. 10 illustrates another example surface of a first gate spacer, in accordance with some embodiments.

FIG. 10 illustrates an example surface 1000 of a first gate spacer or second gate spacer, in accordance with some embodiments. The surface 1000 can include various densified compounds such as the first densified compound 608 or the second densified compound 808 connected (e.g., densified) by the treatment of operations 410, operation 420, and the like. For example, cross-linking between the densified compound can form a chemically stable, passivated surface. The back bones of the individual densified compounds can be referred to as backbones of the gate spacer. For example, the depicted surface can be said to include silicon-carbon-silicon backbones or silicon-oxygen-silicon backbones.

Figure 11:
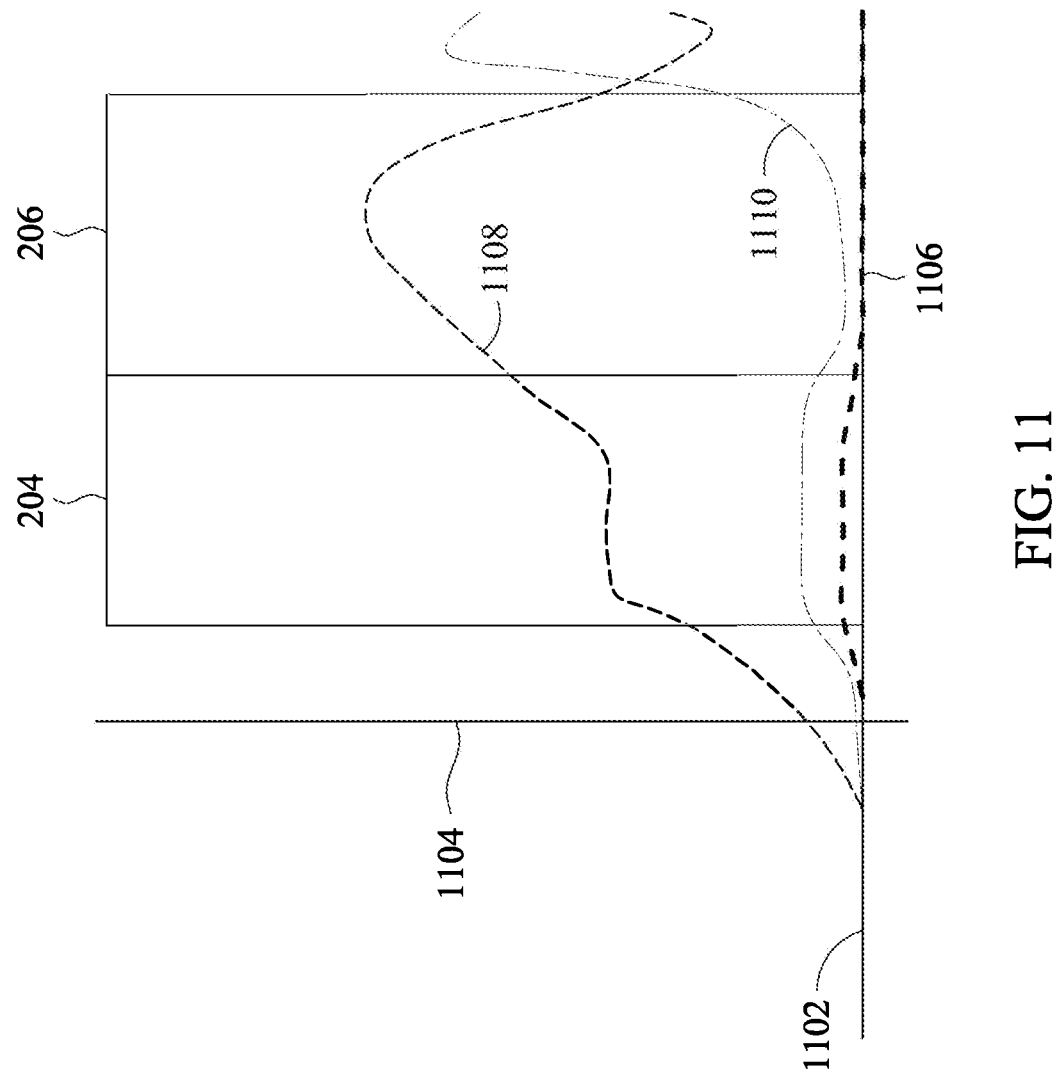
FIGS. 11, 12, and 13 illustrate a composition of a gate spacer assembly along an axis perpendicular to a surface of a gate spacer of the gate spacer assembly, in accordance with some embodiments.

FIG. 11 illustrates a composition of a gate spacer assembly along an axis perpendicular to a surface of a gate spacer of the gate spacer assembly, in accordance with some embodiments. An x-axis 1102 originates at an inner surface of a first gate spacer 204 (e.g., a surface abutting a metal gate 110 or PO layer 202), and terminates at outer surface of a second gate spacer 206. Additional or fewer gate spacers can be included in a gate spacer assembly. A y-axis 1104 originates at zero percent and extends upward in the positive direction. The y-axis 1104 depicts a proportion of various elements present in the gate spacers. The proportion can also be referred to as a concentration. The proportion can include a mass fraction or a molar fraction. The proportion can be an amount present, or an indication of an amount present according to a measurement technique such as electron energy loss spectroscopy. Thus, the depicted proportions can include some variability or smoothing relative to the composition of the respective gate spacers. As discussed above, gradients can be included in gate spacers, or gate spacers can be generally homogenous and characterized by proportional discontinuities at boundaries thereof.

Figure 12:
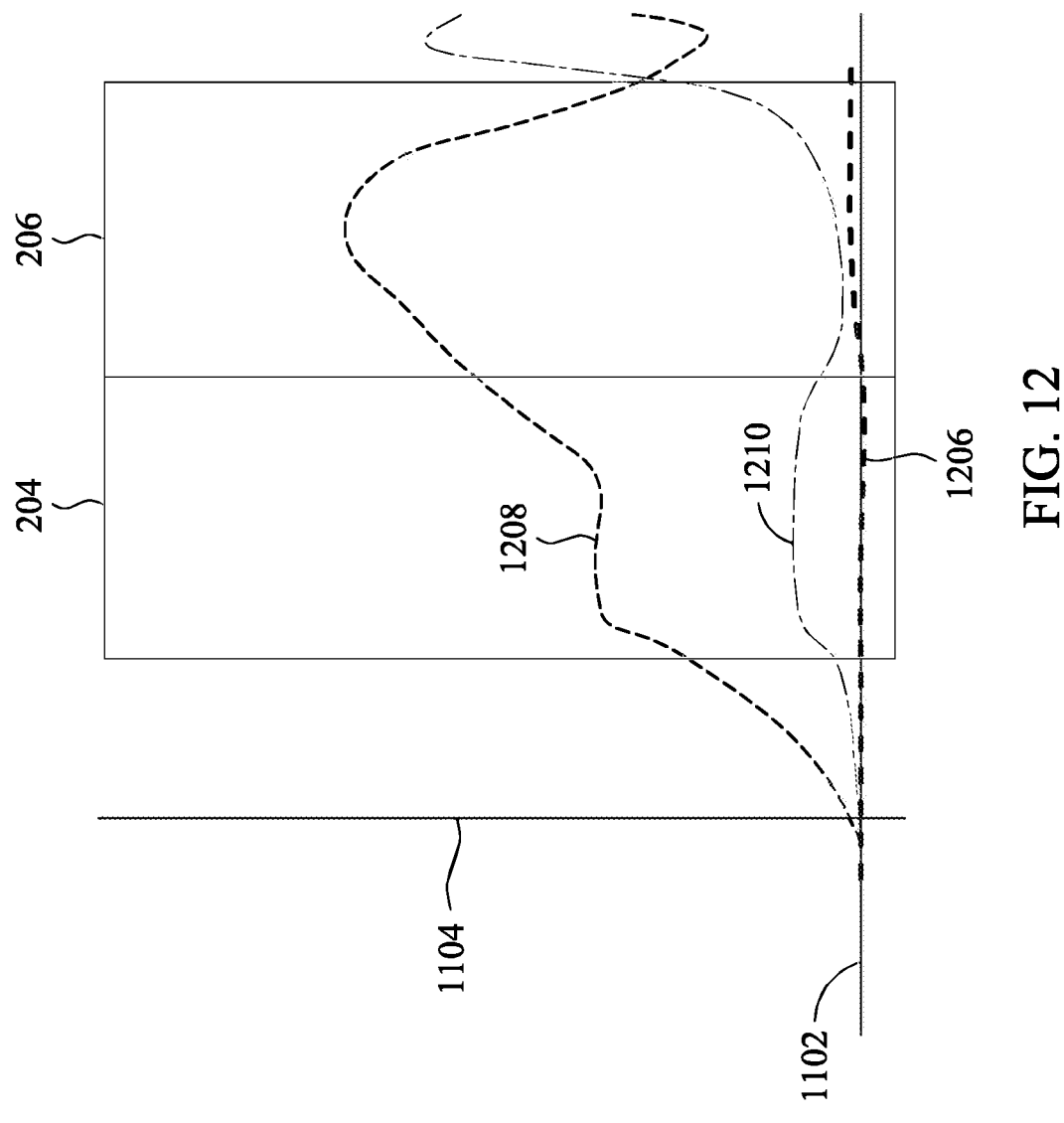
Figure 13:
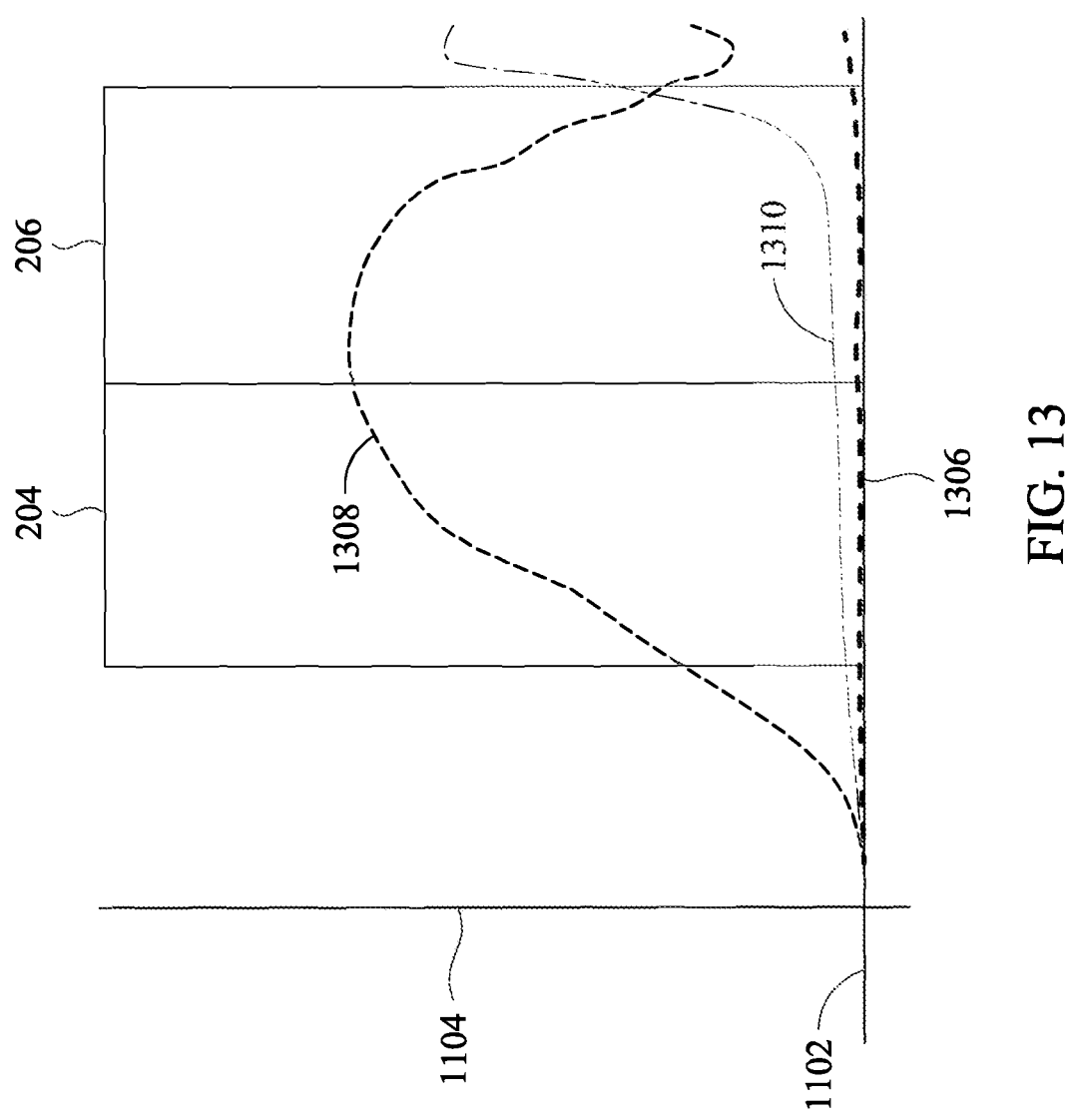

Some example numerical proportions are provided henceforth, which can be indicative of maximum values for respective gate spacers, or average values for respective gate spacers. Such values are not intended to be limiting. For example, FIGS. 12 and 13 provide further examples. A proportion of nitrogen 1106 is depicted as having a highest proportion along the first gate spacer 204. For example, the proportion of nitrogen can be up to about five percent in the first gate spacer 204, and about zero percent in the second gate spacer 206. A proportion of carbon 1108 can vary from about fifteen percent in the first gate spacer 204 to about ten percent in the second gate spacer 206. A proportion of oxygen 1110 can vary from about twenty percent in the first gate spacer 204 to about ten percent in the second gate spacer 206.

FIG. 12 illustrates a composition of a gate spacer assembly along an axis perpendicular to a surface of a gate spacer of the gate spacer assembly, in accordance with some embodiments. The composition is plotted against the same x-axis 1102 and y-axis 1104 of FIG. 11, however, as for other figures presented herein, the figures are not drawn to scale. For example, a relative thickness of a gate spacer may vary between figures. As for FIG. 11, the y-axis 1104 depicts a proportion of various elements present in the gate spacers. The proportion can include a mass fraction or a molar fraction. The proportion can be an amount present, or an indication of an amount present according to a measurement technique such as electron energy loss spectroscopy.

Some example numerical proportions are provided henceforth, which can be indicative of maximum values for respective gate spacers, or average values for respective gate spacers. Such values are not intended to be limiting. A proportion of nitrogen 1206 is zero in the first gate spacer 204 and the second gate spacer 206, which may depict an absence of nitrogen, a presence of nitrogen below a limit of detection, or a presence of nitrogen below another threshold. A proportion of carbon 1208 can vary from about fifteen percent in the first gate spacer 204 to about ten percent in the second gate spacer 206. A proportion of oxygen 1210 can vary from about twenty percent in the first gate spacer 204 to about ten percent in the second gate spacer 206.

FIG. 13 illustrates a composition of a gate spacer assembly along an axis perpendicular to a surface of a gate spacer of the gate spacer assembly, in accordance with some embodiments. The composition is plotted against the same x-axis 1102 and y-axis 1104 of FIGS. 11 and 12, however, as for other figures presented herein, the figures are not drawn to scale. For example, a relative thickness of a gate spacer may vary between figures. As for FIGS. 11 and 12, the y-axis 1104 depicts a proportion of various elements present in the gate spacers. The proportion can include a mass fraction or a molar fraction. The proportion can be an amount present, or an indication of an amount present according to a measurement technique such as electron energy loss spectroscopy.

Some example numerical proportions are provided henceforth, which can be indicative of maximum values for respective gate spacers, or average values for respective gate spacers. Such values are not intended to be limiting. A proportion of nitrogen 1306 is zero in the first gate spacer 204 and the second gate spacer 206, which may depict an absence of nitrogen, a presence of nitrogen below a limit of detection, or a presence of nitrogen below another threshold. A proportion of carbon 1308 can vary between about one percent and about five percent in each of the first gate spacer 204 and the second gate spacer 206. A proportion of oxygen 1310 can vary between about sixty percent and seventy percent in each of the first gate spacer 204 and the second gate spacer 206.

Figure 14:
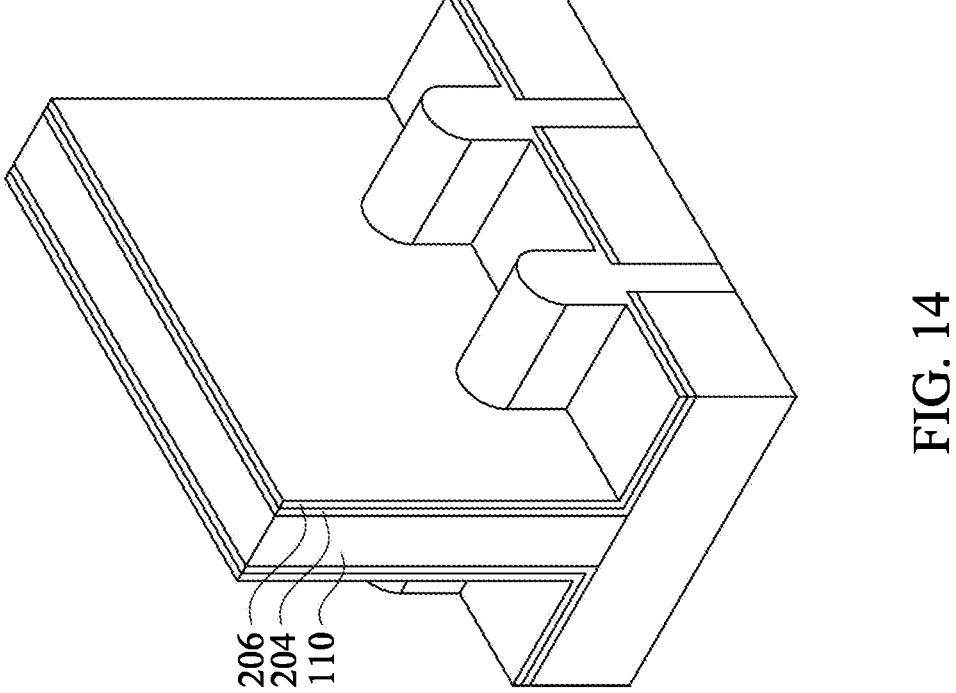
FIG. 14 illustrates a cross-sectional view of an example FinFET device during fabrication stages, in accordance with some embodiments.

FIG. 14 illustrates a cross-sectional view of an example FinFET device during fabrication stages, in accordance with some embodiments. For example the upper surface of the FinFET device is depicted as planarized. The planarization can remove a portion of the first gate spacer 204 or the second gate spacer 206. The sidewall of the PO layer (not depicted) can extend along the first gate spacer 204 or the second gate spacer 206. The PO layer 202 can be removed according to a process such as a selective etching process. The etching process can be selective to the PO layer relative to at least the first gate spacer. The etching process can leave an opening in the absence of the PO layer 202. A metal gate 110 can be formed in the opening vacated by the PO layer. The first gate spacer 204 can extend along a sidewall of the metal gate 110. The second gate spacer 206 can extend along a sidewall of the first gate spacer 204.

In one aspect of the present disclosure, a method for fabricating a semiconductor device is disclosed. The method includes evacuating a chamber to a pressure of less than about 1 Torr. The method includes heating the chamber to a temperature in excess of about 400° C. The method includes introducing a precursor into the chamber. The method includes decomposing the precursor with a first plasma. The method includes depositing a first layer on a surface of the semiconductor device based on the decomposed precursor. The method includes densifying the precursor to form a first gate spacer. The method includes introducing the precursor into the chamber subsequent to forming the first layer. The method includes decomposing the precursor with a second plasma, different than the first plasma. The method includes depositing a second layer, different from the first layer, on the surface of the semiconductor device based on the decomposed precursor. The method includes densifying the precursor to form a second gate spacer.

In another aspect of the present disclosure, a method is disclosed. The method can be employed for fabricate semiconductor devices. The method includes introducing a precursor to a chamber. The method includes decomposing the precursor with a first plasma configured at a first power level. The method includes depositing a first layer on a surface of a semiconductor device based on the decomposed precursor. The method includes densifying the first layer with a second plasma configured at a second power level greater than the first power level. The method includes repeating the deposition and densification operations to form a first gate spacer on the surface of the semiconductor device.

In yet another aspect of the present disclosure, a semiconductor devices is disclosed. The semiconductor device includes a metal gate. The semiconductor device includes a first dielectric layer extending along a sidewall of the metal gate. The first dielectric layer includes various cross-linked first silicon-oxygen-silicon backbones, cross-linked first silicon-nitrogen-silicon backbones, cross-linked first silicon-carbon-silicon backbones. The semiconductor device includes a second dielectric layer extending along the first dielectric layer and comprising at least one of cross-linked second silicon-oxygen-silicon backbones, or cross-linked second silicon-carbon-silicon backbones.

As used herein, the terms "about" and "approximately" generally mean plus or minus 10% of the stated value. For example, about 0.5 would include 0.45 and 0.55, about 10 would include 9 to 11, about 1000 would include 900 to 1100.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure

What is claimed is:

1. A method for fabricating a semiconductor device, comprising:

evacuating a chamber to a pressure of less than about 1 Torr;

heating the chamber to a temperature in excess of about 400° C.;

introducing a precursor including tetramethyldisiloxane (TMDSO) into the chamber;

decomposing the precursor with a non-oxidizing first plasma comprising nitrogen radicals and at least one of hydrogen radicals or oxygen radicals;

depositing a first layer on a surface of the semiconductor device based on the decomposed precursor;

densifying the precursor to form a silicon oxycarbide-based first gate spacer having a carbon content of greater than ten percent;

introducing the precursor into the chamber subsequent to forming the first layer;

decomposing the precursor with a non-oxidizing second plasma, different than the first plasma, wherein the second plasma comprises at least one of hydrogen radicals or oxygen radicals and includes no more than one-tenth the nitrogen radicals of the first plasma;

depositing a second layer, different from the first layer, on the surface of the semiconductor device based on the decomposed precursor; and densifying the precursor to form a silicon oxycarbide-based second gate spacer having a carbon content of less than the first gate spacer.

2. The method of claim 1, wherein:

the first gate spacer has a thickness of between about 0.5 nm to about 2 nm; and the second gate spacer has a thickness of between about 1.5 and about 3.5 nm.

3. The method of claim 1, wherein:

the deposition of the first layer is according to an atomic layer deposition process comprising alternating precursor introduction and plasma exposure cycles.

4. The method of claim 1, wherein the semiconductor device comprises a FinFET transistor and further comprising:

removing a portion of the first gate spacer, a portion of the second gate spacer, and a dummy gate of the FinFET transistor; and depositing a metal gate abutting the first gate spacer.

5. The method of claim 1, wherein:

a dielectric constant of the first gate spacer is less than about 4.8; and a dielectric constant of the second gate spacer is less than the first layer.

6. A method for fabricating semiconductor devices, comprising:

introducing a precursor including tetramethyldisiloxane (TMDSO) to a chamber;

decomposing the precursor with a non-oxidizing first plasma comprising nitrogen radicals and at least one of hydrogen radicals or oxygen radicals configured at a first power level;

depositing a first layer on a surface of a semiconductor device based on the decomposed precursor;

densifying the first layer with a second plasma configured at a second power level greater than the first power level; and repeating the deposition of the first layer on the surface of the semiconductor device based on the decomposed precursor alternated with densifying the first layer with the second plasma configured at the second power level greater than the first power level to form a silicon oxycarbide-based first gate spacer on the surface of the semiconductor device.

7. The method of claim 6, wherein the first plasma comprises at least one of hydrogen radicals, nitrogen radicals, or oxygen radicals.

8. The method of claim 6, further comprising cross-linking the decomposed precursor.

9. The method of claim 6, further comprising:

introducing a further precursor to the chamber;

decomposing the further precursor with a third plasma configured at a third power level, less than the second power level;

depositing a second layer on the surface of the semiconductor device with a fourth plasma configured at a fourth power level, greater than the third power level; and repeating the deposition of the first layer on the surface of the semiconductor device based on the decomposed precursor and densifying the first layer with the second plasma configured at the second power level greater than the first power level to form a second gate spacer on the surface of the semiconductor device.

10. The method of claim 9, wherein the precursor and the further precursor comprise tetramethyldisiloxane (TMDSO).

11. The method of claim 9, wherein the second plasma comprises at least one of hydrogen radicals or oxygen radicals.

12. The method of claim 9, wherein each of the first power level and the third power level are less than about 1 kW, and each of the second power level and the fourth power level are greater than double the first power level and the third power level, respectively.

13. The method of claim 9, wherein:

a dielectric constant of the first gate spacer is less than about 3.8;

a dielectric constant of the second gate spacer is greater than the dielectric constant of the first gate spacer;

the first gate spacer comprises nitrogen at a concentration of between about one percent and about five percent; and the second gate spacer comprises nitrogen at a concentration of less than about one percent.

14. The method of claim 9, wherein:

a temperature of the chamber is between about 450° C. and about 600° C.; and a pressure of the chamber varies between about 0.5 Torr and about 1 Torr.

15. The method of claim 9, wherein each of the first power level, the second power level, the third power level, and the fourth power level comprise RF power introduced at a frequency of about 13.65 Mhz.

16. The method of claim 6, further comprising:

removing a poly-silicon layer of the semiconductor device; and forming a metal gate abutting the first gate spacer;

wherein the semiconductor device is a FinFET transistor.

17. The method of claim 6, wherein:

the first plasma consists essentially of hydrogen which is introduced to the chamber at about 20,000 SLM; and the precursor is introduced at a flow rate of about 7000 standard liters per minute (SLM).

18. A method for fabricating a semiconductor device, comprising:

introducing a precursor including tetramethyldisiloxane (TMDSO) into a chamber;

decomposing the precursor with a non-oxidizing first plasma;

depositing a first layer on a surface of the semiconductor device based on the decomposed precursor;

densifying the precursor to form a first gate spacer comprising:

a plurality of cross-linked first silicon-oxygen-silicon backbones; and a plurality of cross-linked first silicon-carbon-silicon backbones;

introducing the precursor into the chamber subsequent to forming the first layer;

decomposing the precursor with a non-oxidizing second plasma, different than the first plasma;

depositing a second layer, different from the first layer, on the surface of the semiconductor device based on the decomposed precursor; and densifying the precursor to form a second gate spacer comprising one of:

a plurality of cross-linked second silicon-oxygen-silicon backbones; or a plurality of cross-linked second silicon-carbon-silicon backbones.

19. The method of claim 18, wherein the second gate spacer is thicker than the first gate spacer.

20. The method of claim 18, wherein each of the first gate spacer and the second gate spacer comprise:

between about 45% and about 70% oxygen;

between about 3% and about 20% carbon; and less than about 10% nitrogen.

* * * * *